US006232832B1

United States Patent
Kirkpatrick, II

(10) Patent No.: US 6,232,832 B1
(45) Date of Patent: May 15, 2001

(54) CIRCUIT FOR LIMITING AN OUTPUT VOLTAGE TO A PERCENT OF A VARIABLE SUPPLY VOLTAGE

(75) Inventor: Richard A. Kirkpatrick, II, Richardson, TX (US)

(73) Assignee: Honeywell International Inc, Morristown, NJ (US)

( * ) Notice: Subject to any disclaimer, the term of this patent is extended or adjusted under 35 U.S.C. 154(b) by 0 days.

(21) Appl. No.: 08/582,237

(22) Filed: Jan. 3, 1996

Related U.S. Application Data

(63) Continuation of application No. 08/277,389, filed on Jul. 19, 1994, now abandoned.

(51) Int. Cl.[7] ............................................. G06G 7/12
(52) U.S. Cl. ................................... 327/560; 327/309
(58) Field of Search .................................. 327/309, 323, 327/552, 560, 561, 562, 563

(56) References Cited

U.S. PATENT DOCUMENTS

| | | | |
|---|---|---|---|
| 3,736,517 | * | 5/1973 | Lim ........................................ 327/561 |
| 3,743,950 | * | 7/1973 | Sellari, Jr. et al. ................... 327/561 |
| 3,822,408 | * | 7/1974 | Veranth ................................. 327/323 |
| 3,999,084 | * | 12/1976 | Beaudette ............................. 327/323 |
| 4,051,385 | * | 9/1977 | Greenaway et al. ................. 327/561 |
| 4,734,594 | | 3/1988 | Nelson . |
| 4,760,285 | | 7/1988 | Nelson . |
| 4,859,881 | * | 8/1989 | Yamamoto et al. .................. 327/552 |
| 5,177,382 | * | 1/1993 | Kondo et al. ........................ 327/552 |
| 5,192,884 | * | 3/1993 | Kusano ................................ 327/552 |
| 5,216,375 | * | 6/1993 | Tanigawa et al. ................... 327/335 |
| 5,263,192 | * | 11/1993 | Mittel et al. ......................... 327/552 |

\* cited by examiner

*Primary Examiner*—Terry D. Cunningham
(74) *Attorney, Agent, or Firm*—William D Lanyi; Andrew A. Abeyta

(57) ABSTRACT

A temperature compensation circuit is provided for use in conjunction with a Hall effect element in which the temperature compensating resistors, or epitaxial resistors, are not placed in the signal loop as portions of the feedback loops of amplifiers. The circuit therefore permits a higher degree of linearity and temperature compensation without inducing the problems that are normally caused by varying voltage potentials across the epitaxial resistors. One embodiment of the circuit also provides a means for clamping, or truncating the output voltage of the circuit to a preselected percentage of the supply voltage even though the supply voltage may vary during the operation of the device. The circuit utilizes several external trimmable resistors to perform final adjustment on the circuit in order to permit individual variations from component to component to be compensated.

7 Claims, 14 Drawing Sheets

CIRCUIT FOR LIMITING AN OUTPUT VOLTAGE TO A PERCENT OF A VARIABLE SUPPLY VOLTAGE

This application is a continuation of application Ser. No. 08/277,389, filed Jul. 19, 1994 now abandoned.

BACKGROUND OF THE INVENTION

1. Field of the Invention

The present invention relates generally to a temperature compensation circuit for a Hall effect element and, more particularly, to a temperature compensation circuit which prevents temperature compensation resistors from having a voltage potential across them which varies when the output of a Hall element changes.

2. Description of the Prior Art

Hall effect elements are well known to those skilled in the art. For example, Hall effect elements have been used for many years in devices which sense the movement of magnetic material through a detection zone. Geartooth sensors and vane sensors have been used in automobiles to monitor the position of rotating objects. Geartooth sensors have been used to monitor the rotation of crank shafts and cam shafts in conjunction with an automobile engine and, in addition, certain types of geartooth sensors have been used in conjunction with automatic braking systems.

A problem that exists in the use and application of Hall effect elements biased with a constant voltage is that the Hall output voltage varies over temperature primarily as a function of the temperature coefficient of resistance (TCR) of the material in which the Hall element is formed. For example, the output from a typical Hall effect element formed in the N epitaxy, for a constant magnetic field imposed on it, at 25 degrees centigrade is approximately double its output at 150 degrees centigrade. For uses in applications where changes in temperature are expected, some means must be provided to compensate for this temperature induced change in the Hall output voltage. Known temperature compensation circuits typically use temperature sensitive resistors as part of an amplification circuit to compensate for the change in Hall output voltage as a function of temperature. In certain known temperature compensation circuits, epitaxial resistors are used as part of the feedback circuit of an amplifier. Since epitaxial resistors exhibit a resistance at 150 degrees centigrade which is approximately double their resistance at 25 degrees centigrade, the inverse relationship between the resistance change in an epitaxial resistor and the voltage change in a Hall effect element formed in the same epitaxy can be used as a canceling compensation method.

U.S. Pat. No. 4,760,285, which issued to Nelson on Jul. 26, 1988, discloses a Hall effect device with epitaxial layer resistive means for providing temperature independent sensitivity. In this linear Hall effect integrated circuit, the output signal of the Hall element is amplified by a circuit whose gain is determined by a resistor that is partially formed in the same epitaxial layer as the Hall element. A first amplifier stage is configured as a voltage to current converter and is connected through a current mirror to a second amplifier stage that is configured as a current to voltage converter.

U.S. Pat. No. 4,734,594, which issued to Nelson on Mar. 29, 1988, describes a canceling compensation method for a sensor with temperature dependent sensitivity. The Hall effect device described in this patent has null (i.e. zero magnetic flux density) offset voltage compensation. The output terminals of the Hall effect element, which are formed in an epitaxial layer, are connected to a differential current source. The sum of the first and second currents produced by the source is determined by a resistor formed in the epitaxial layer in which the Hall effect element is formed. It is powered by the same electrical source as the Hall effect element so as to produce a current which tracks the current through the Hall effect element as a function of both temperature and the electrical source. The current through the resistor is split by a pair of trimmable temperature insensitive resistors and supplied to a pair of cross-coupled current mirrors which supply the currents to the output terminals of the Hall effect element.

When epitaxial resistors are used in the signal path to compensate for the output voltage changes in a Hall effect element as a function of temperature, an additional problem is introduced into the Hall circuit. Since epitaxial resistors exhibit a change in their resistance as a function of the voltage potential across them, their use in the feedback circuit of an amplifier can introduce errors in the resulting output of the Hall circuit. Although the effect on the resistance of an epitaxial resistor as a function of the voltage potential across it is relatively small, this variability in the resistance can deleteriously impact a Hall effect amplification circuit with an extremely high linearity requirement.

In order to avoid this problem that is caused by the change of the resistance in an epitaxial resistor as a function of the applied voltage potential, it would be significantly beneficial if a temperature compensation and amplification circuit could be provided which utilizes the epitaxial resistors in a configuration where the applied voltage potential is constant.

SUMMARY OF THE INVENTION

In a preferred embodiment of the present invention, a temperature compensation circuit comprises a Hall effect element which has a first output signal that is representative of a magnetic field imposed on the Hall effect element. In addition, it comprises an amplification circuit which has an input connected in signal communication with the first output signal from the Hall effect element. The amplification circuit has a second output which is representative of the magnetic field. In addition, a preferred embodiment of the present invention comprises a temperature compensation circuit which has at least one temperature sensitive resistor connected within the temperature compensation circuit to prevent changes in the first output signal from affecting the voltage potential across the temperature sensitive resistor.

The amplification circuit in a preferred embodiment of the present invention comprises a first amplifier and a second amplifier. The first amplifier has a first transistor connected between its output and its inverting input. The second amplifier has a second transistor connected between its output and its inverting input. A resistor is connected between the inverting inputs of the first and second amplifiers. The amplification circuit comprises a third amplifier with its noninverting input connected to an output of the first amplifier and its inverting input connected to an output of the second amplifier. The third amplifier has third and fourth output signals whose difference is representative of the magnetic field imposed on the Hall effect element.

A preferred embodiment of the present invention further comprises a fourth amplifier having its noninverting input connected to the third output signal and its inverting input connected to the fourth output signal. The fourth amplifier has a temperature sensitive feedback connected between its output and its inverting input. A fifth amplifier has a temperature sensitive signal connected to its noninverting input and its output is connected to the noninverting input of the fourth amplifier.

A particularly preferred embodiment of the present invention further comprises a means for variably adjusting the output of the fourth amplifier, a means for variably adjusting the signal connected to the noninverting input of the fifth amplifier and a sixth amplifier which has its inverting input connected to the output of the fourth amplifier. A means is provided for variably adjusting the inverting input of the sixth amplifier. Although various methods are available to provide the variable adjustability described above, a preferred embodiment of the present invention utilizes trimmable resistors that can be adjusted during the final manufacturing steps in creating a Hall effect element incorporating the present invention.

BRIEF DESCRIPTION OF THE DRAWINGS

The present invention will be more fully understood from a reading of the Description of the Preferred Embodiment in conjunction with the drawings, in which.

DESCRIPTION OF THE PREFERRED EMBODIMENT

Figure 1:
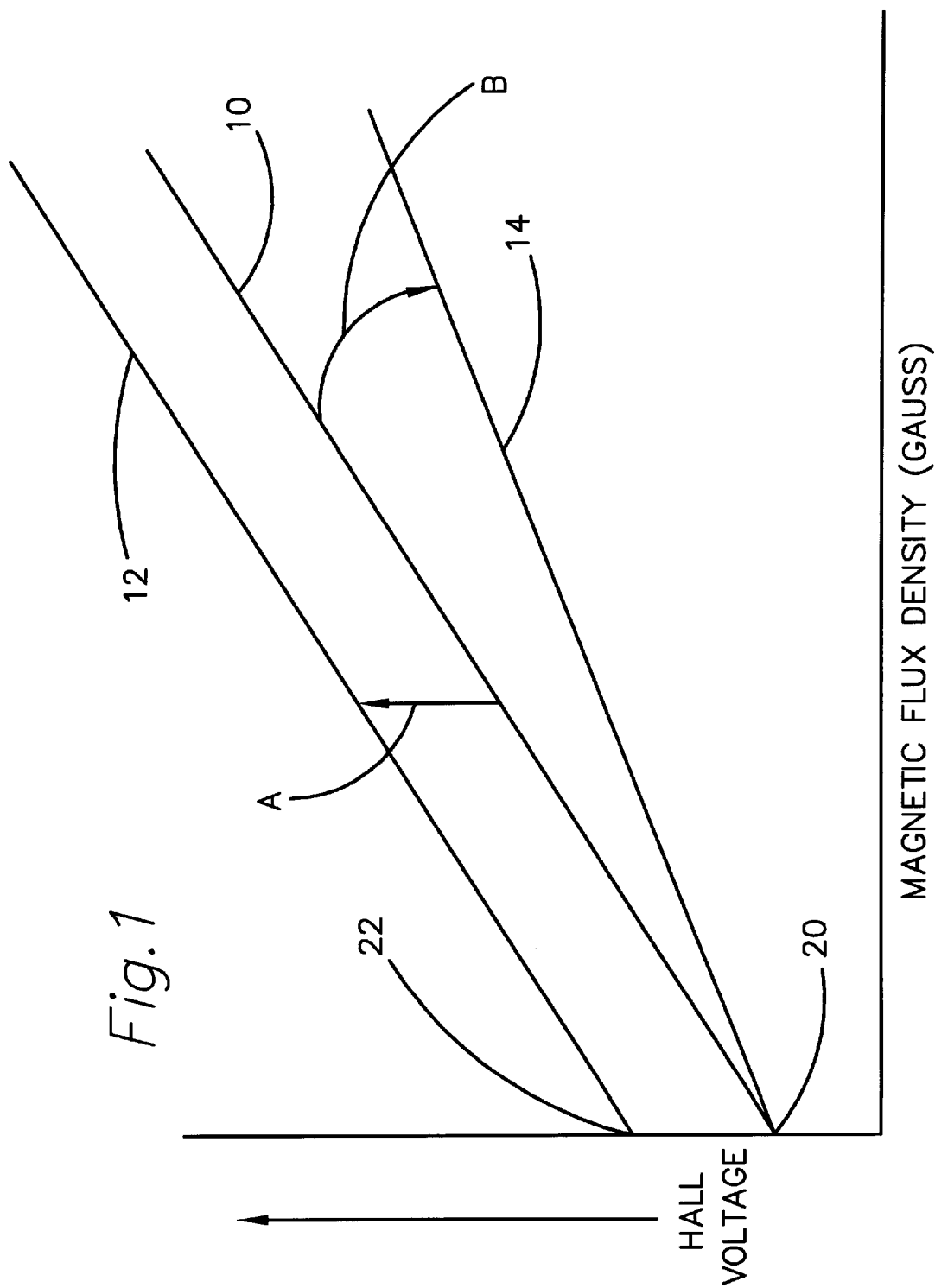
FIG. 1 shows a relationship between a Hall output voltage and a magnetic flux density imposed on the Hall effect element.

Throughout the Description of the Preferred Embodiment, like components will be identified by like reference numerals. In the Description of the Preferred Embodiment, components are generally identified by subscripted reference numerals and letters. However, in the drawings those same components are identified similarly, but without the subscripting characteristics. Although the same letters and numerals are used to identify like components, they are shown in an unsubscripted form in the drawings, but in a subscripted form in the specification. This was done to simplify and clarify the illustrations which, in many cases, comprise a large plurality of components that could otherwise lead to possible confusion in their identification if subscripting was used. In addition, many of the circuit elements shown in FIGS. 9–14 are illustrated individually in the other figures. This is done to permit the individual subcircuits to be described in greater detail while avoiding the need to describe each component in the more complex circuits of FIGS. 9–14 which do not relate directly to the operation or use of the present invention. Throughout the Description of the Preferred Embodiment, repeated reference is made to the Hall effect element. It should be understood, however, that in most applications of the present invention, a quad-Hall device is actually used in which four individual Hall elements are interconnected. This technique of using four Hall elements for these purposes is well known to those skilled in the art and will not be described in greater detail herein.

FIG. 1 illustrates the basic problem toward which the present invention is directed. An exemplary relationship between the Hall voltage and the magnetic field imposed on the Hall element is represented by line 10 in FIG. 1. As described above, changes in temperature can affect the magnitude of the Hall voltage. This affect can occur in at least two ways. First, the Hall voltage for all values of magnetic field can change, as represented by arrow A, and the result is a relationship represented by line 12. The relationship between the Hall voltage and the magnetic field can also be changed in the manner represented by arrow B which results in the relationship identified by line 14. Arrow B illustrates a change in the sensitivity, or gain, of the Hall element and arrow A represents a change in the offset, or null, value of the device. Reference numeral 20 identifies a first null voltage and reference numeral 22 represents the null voltage that results from a change in temperature. The relationships represented by lines 12 and 14 would cause an erroneous output from the Hall amplifying circuit if some means were not provided to compensate for the temperature change.

Figure 2:
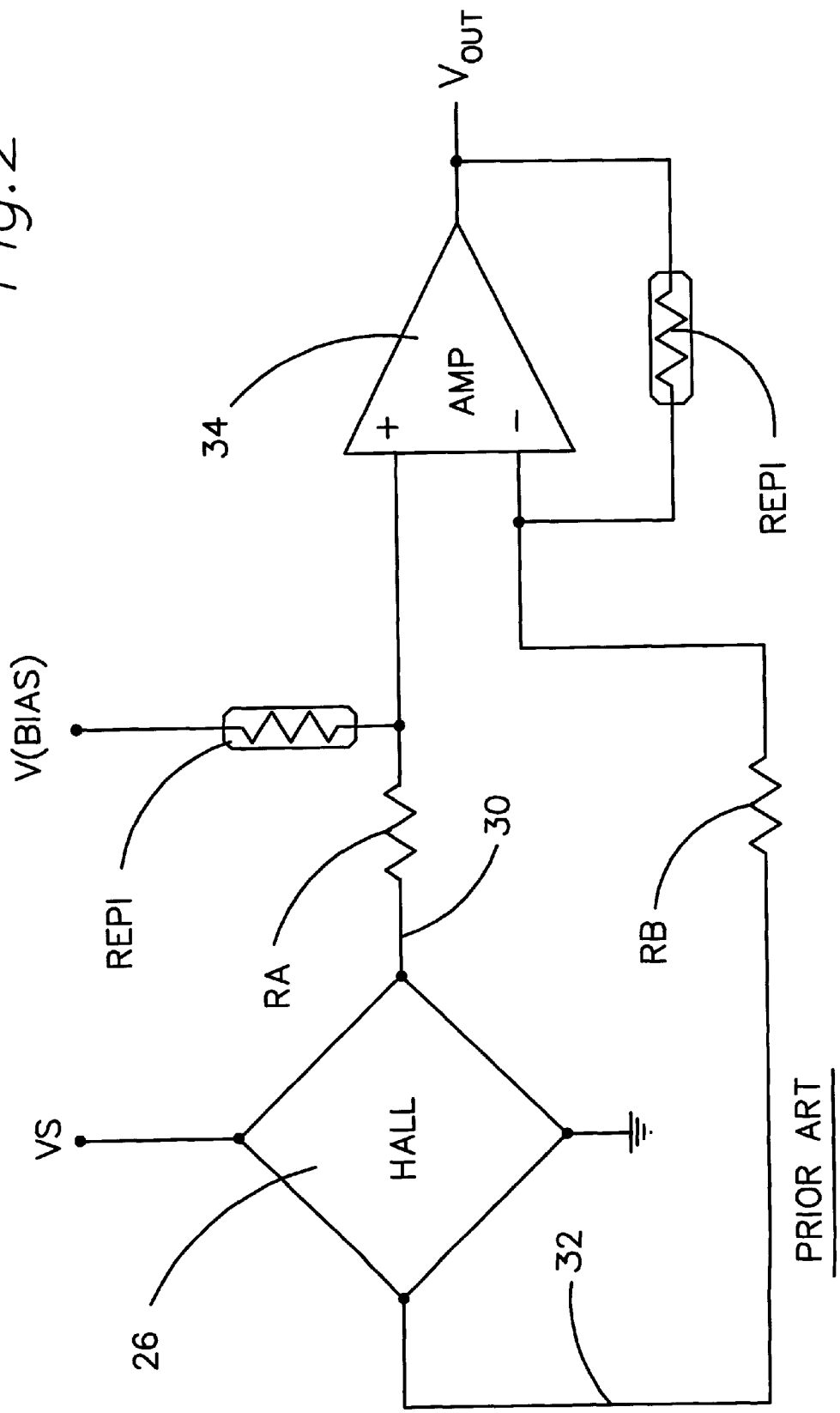
FIG. 2 shows a prior art technique for compensating the output of a Hall device.

As described above, it is well known to use epitaxial resistors in a temperature compensation circuit for a Hall element. FIG. 2 is a simplified schematic of a known method for temperature compensation. In a manner well known to those skilled in the art, a Hall device 26 is connected between a supply voltage $V_S$ and a point of ground potential. When the Hall device is subjected to a magnetic field perpendicular to it, the voltage difference between lines 30 and 32 are representative of the strength of the magnetic field. These voltages are provided, through resistors $R_A$ and $R_B$, to the noninverting and inverting inputs of an amplifier 34. A bias voltage is provided to the noninverting input of the amplifier 34 through an epitaxial resistor $R_{EPI}$ and another epitaxial resistor REPI is used in the feedback loop of the amplifier 34. As described above, the resistances of the epitaxial resistors change as a function of temperature inversely to the change in the output voltage of the Hall device 26. In this way, the bias and sensitivity of the circuit shown in FIG. 2 can be compensated for temperature changes. It should be understood that FIG. 2 is a simplified schematic of a temperature compensation circuit and does not illustrate all of the components necessary to provide an actual sensor employing a Hall effect device.

Figure 3:
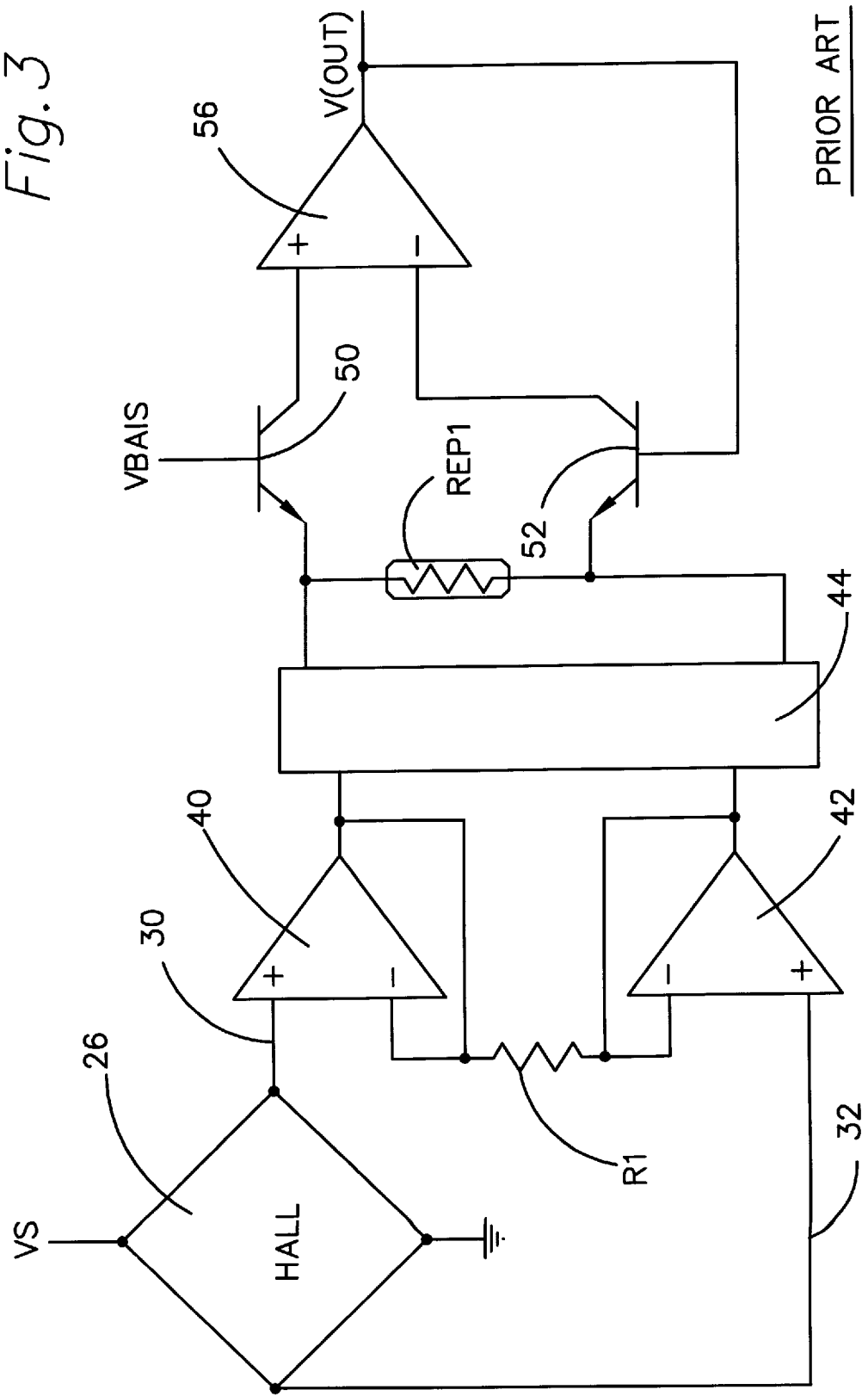
FIG. 3 shows another prior art technique used for providing temperature compensation of a Hall device.

FIG. 3 shows a temperature compensation circuit that is a simplified representation of the type of circuit described in the United States patents discussed above. The precise relationship of these signals is of course, dependent on the direction of the magnetic field. Two amplifiers, 40 and 42, are connected to the outputs from the Hall device 26 as shown. A resistor $R_1$ is connected between the amplifiers and the outputs of the two amplifiers are connected to a current mirror 44. A temperature sensitive epitaxial resistor is connected across the outputs of the current mirror 44, as shown, and two transistors, 50 and 52, are connected between those outputs of the current mirror 44 and the inputs of an amplifier 56. The amplifier 56 provides an output voltage that is representative of the magnetic field imposed on the Hall device 26 with temperature compensation provided by the epitaxial resistor. The types of circuits shown in FIGS. 2 and 3 are generally known to those skilled in the art.

Figure 4:
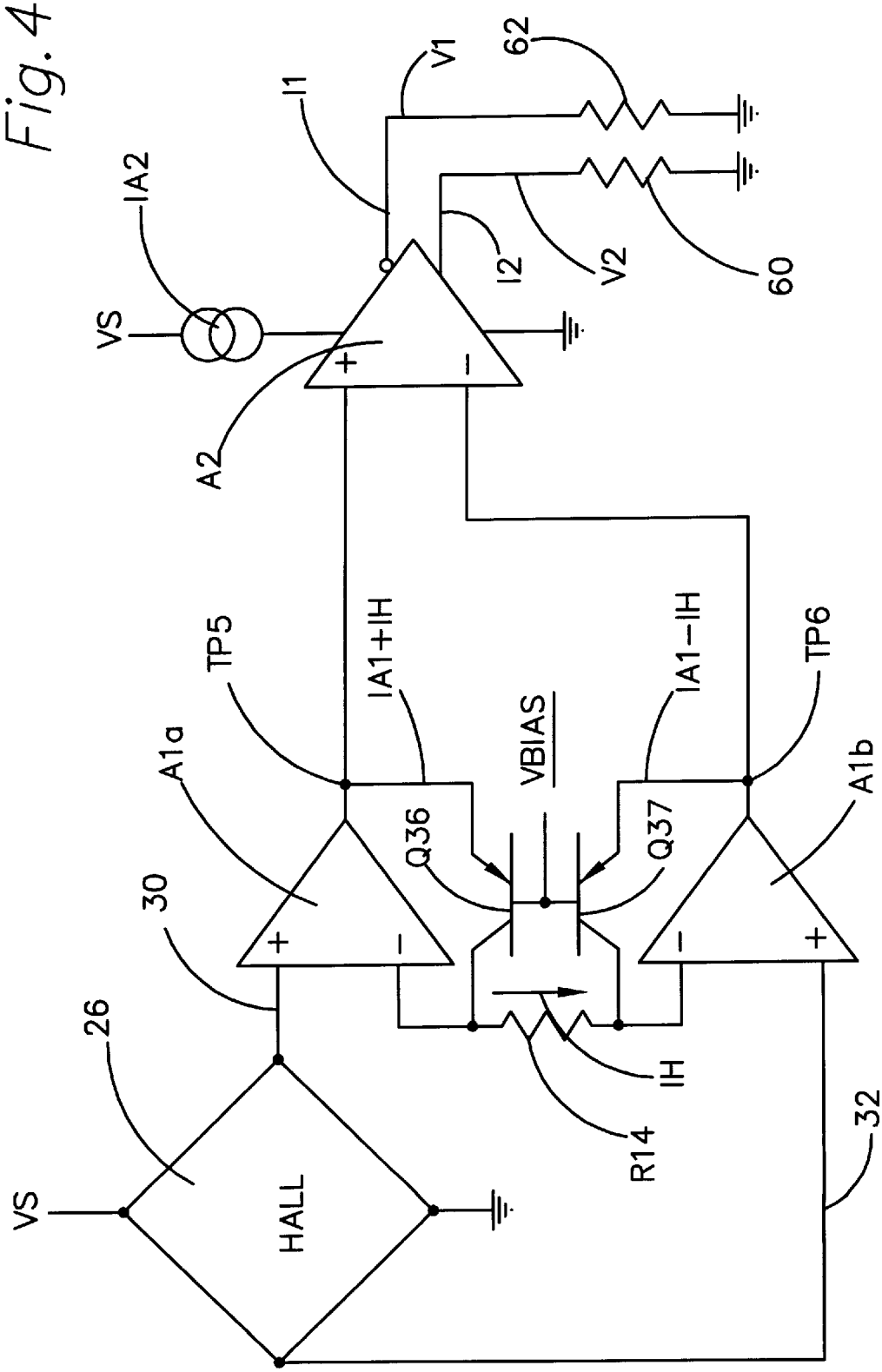
FIG. 4 shows a Hall element with first, second, and third amplifiers.

FIG. 4 shows a simplified schematic of a subcircuit of the present invention. A first amplifier A1a and a second amplifier A1b are provided and connected to the output voltages provided on lines 30 and 32. The first amplifier is provided with a feedback loop that comprises transistor $Q_{36}$. The second amplifier is provided with a feedback loop that comprises transistor $Q_{37}$. Between the inverting input of the first amplifier A1a and the inverting input of the second amplifier A1b, a resistor $R_{14}$ is connected. When the voltage on line 30 differs from the voltage on line 32, a current $I_H$ flows through resistor $R_{14}$. The bases of transistors $Q_{36}$ and $Q_{37}$ are connected to a bias voltage as shown. The current flowing through the emitter of transistor $Q_{36}$ is equal to $I_{A1}$ plus $I_H$ while the current flowing through the emitter of transistor $Q_{37}$ is equal to $I_{A1}$ minus $I_H$. The polarity of $I_H$ depends on the polarity of the magnetic field.

The outputs of the first and second amplifiers are connected to a third amplifier $A_2$ as shown. A current source is provided which supplies the third amplifier with a current $I_{A2}$. The third amplifier $A_2$ has a differential current output which provides two currents, $I_1$ and $I_2$ which are connected through resistors, 60 and 62, to a point of ground potential. This provides voltage potentials of $V_1$ and $V_2$ as shown.

Figure 5:
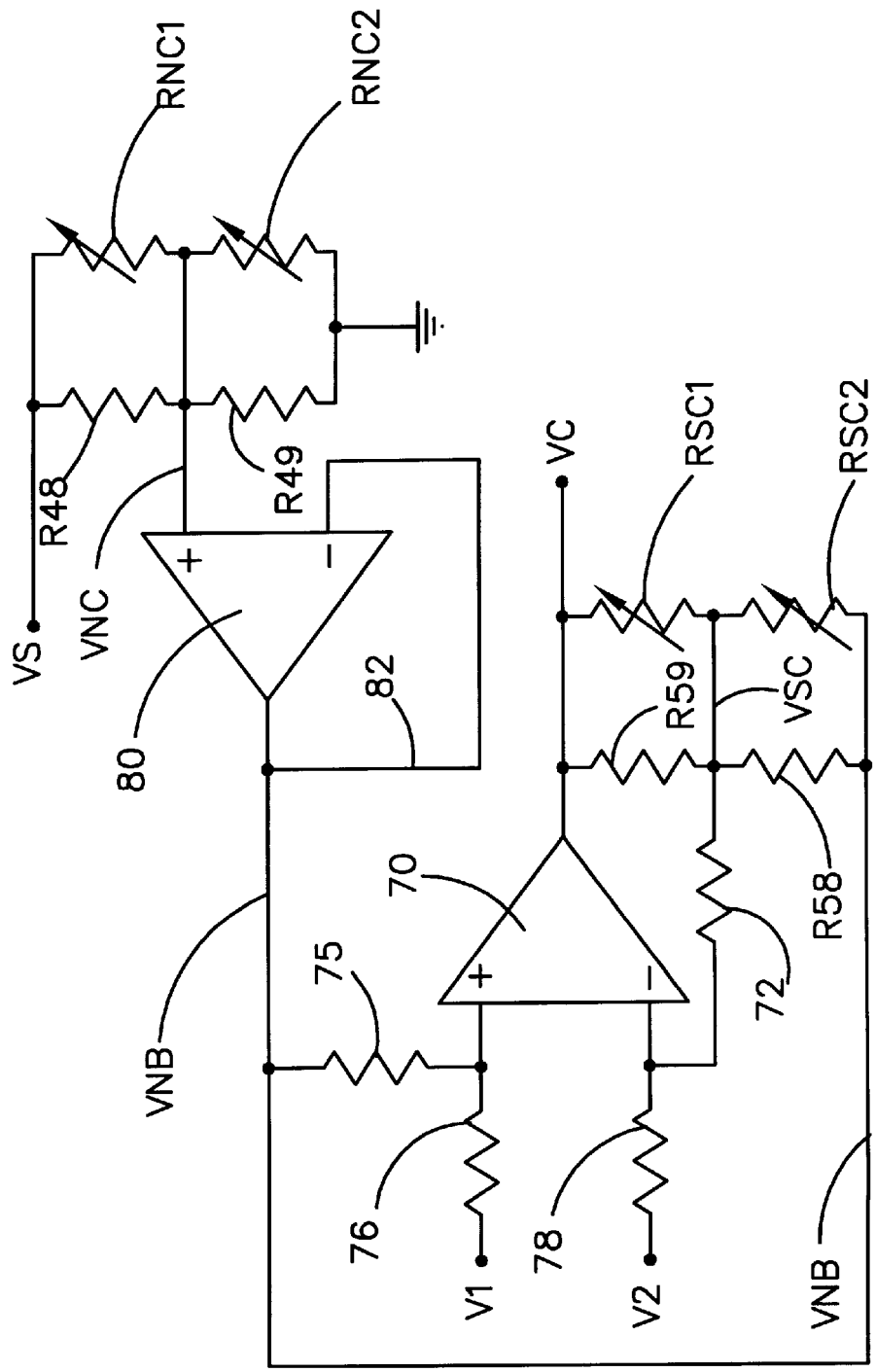
FIG. 5 shows the fourth and fifth amplifiers used in conjunction with the present invention.

The two signals, $V_1$ and $V_2$, with FIG. 4 are provided as inputs to a fourth amplifier 70 as shown in FIG. 5. The fourth amplifier 70 is provided with a feedback loop that comprises, in addition to resistor 72, two temperature sensitive resistors, $R_{59}$ and $R_{58}$. These temperature sensitive resistors are used to adjust the output of amplifier 70 to compensate for gain changes in signals $V_1$ and $V_2$ as a result of temperature changes affecting the Hall device 26. In order to permit the output $V_C$ to be adjusted for the particular characteristics of each Hall device, trimmable resistors $R_{SC1}$ and $R_{SC2}$ are provided on an external chip and connected as shown. Resistors 76 and 78 are connected between the inputs of amplifier 70 as shown and the outputs of the third amplifier illustrated in FIG. 4. Resistors $R_{SC1}$ and $R_{SC2}$ are external film resistors that exhibit a nearly zero thermal coefficient of resistivity (TCR).

With continued reference to FIG. 5, a fifth amplifier 80 is provided with its output $V_{NB}$ connected to the noninverting input of the fourth amplifier 70 through R75. The inverting input of the fifth amplifier 80 is connected directly to its output in a voltage follower configuration as shown. The noninverting input of the fifth amplifier 80 is connected to two temperature sensitive resistors, $R_{48}$ and $R_{49}$, as shown. Trimmable resistors $R_{NC1}$ and $R_{NC2}$ are external film resistors which exhibit a nearly zero thermal coefficient of resistivity (TCR). The external trimmable resistors are used to permit each individual Hall device to be adjusted to suit its own particular characteristics. Temperature sensitive resistors $R_{48}$ and $R_{49}$ are used to adjust the circuit output to compensate for offset changes in the device as a result of temperature changes affecting the offset voltages of the Hall device 26 and amplifiers A1–6.

Figure 6:
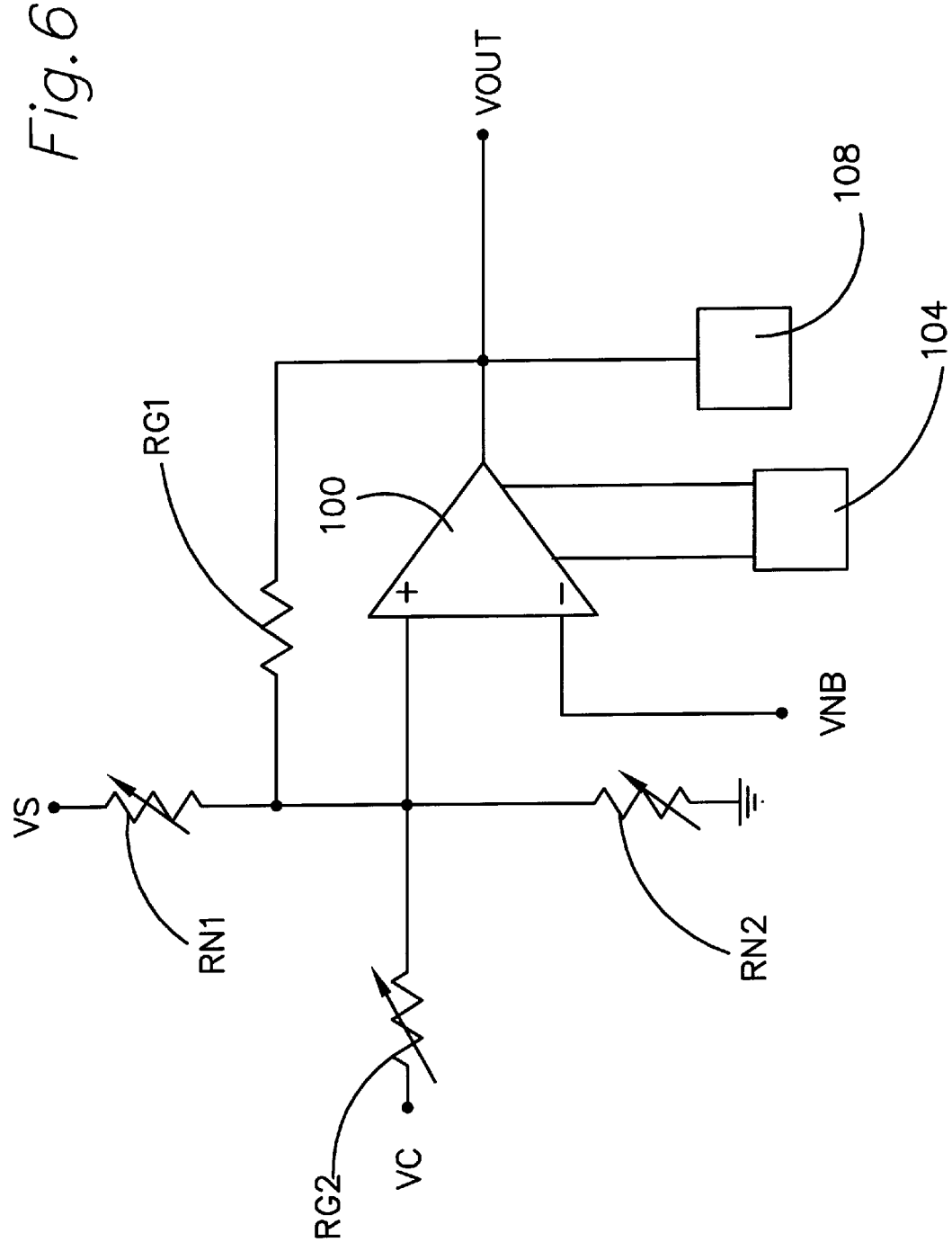
FIG. 6 shows a sixth amplifier used to provide an output of a Hall device and also permit final trim adjustments to improve the linearity of the device.

FIG. 6 shows the final stage of a temperature compensation circuit made in accordance with the present invention. The output from the circuit: in FIG. 5, which is identified as $V_C$, is connected as an input to the sixth amplifier 100 shown in FIG. 6. The $V_C$ signal is connected to the inverting input of the sixth amplifier 100 through $R_{G2}$, and the noninverting input is connected to the $V_{NB}$ signal identified as the output of the fifth amplifier 80 shown in FIG. 5. Trimmable resistors $R_{N1}$, $R_{N2}$ and $R_{G2}$ are provided in order to permit the room temperature transfer function to be adjusted for offset and sensitivity to minimize the minor deviations of a particular Hall effect apparatus from the ideal transfer function. Although the compensation techniques described in conjunction with FIGS. 2–6 are adequate to compensate the device for the effects of temperature and non-ideal device characteristics, it should be understood that each individual Hall effect apparatus can exhibit some minor deviation about a central mean for any particular characteristic or parameter. The trimmable resistors permit minor modifications to be made which minimize these variations about the central mean.

Figure 7:
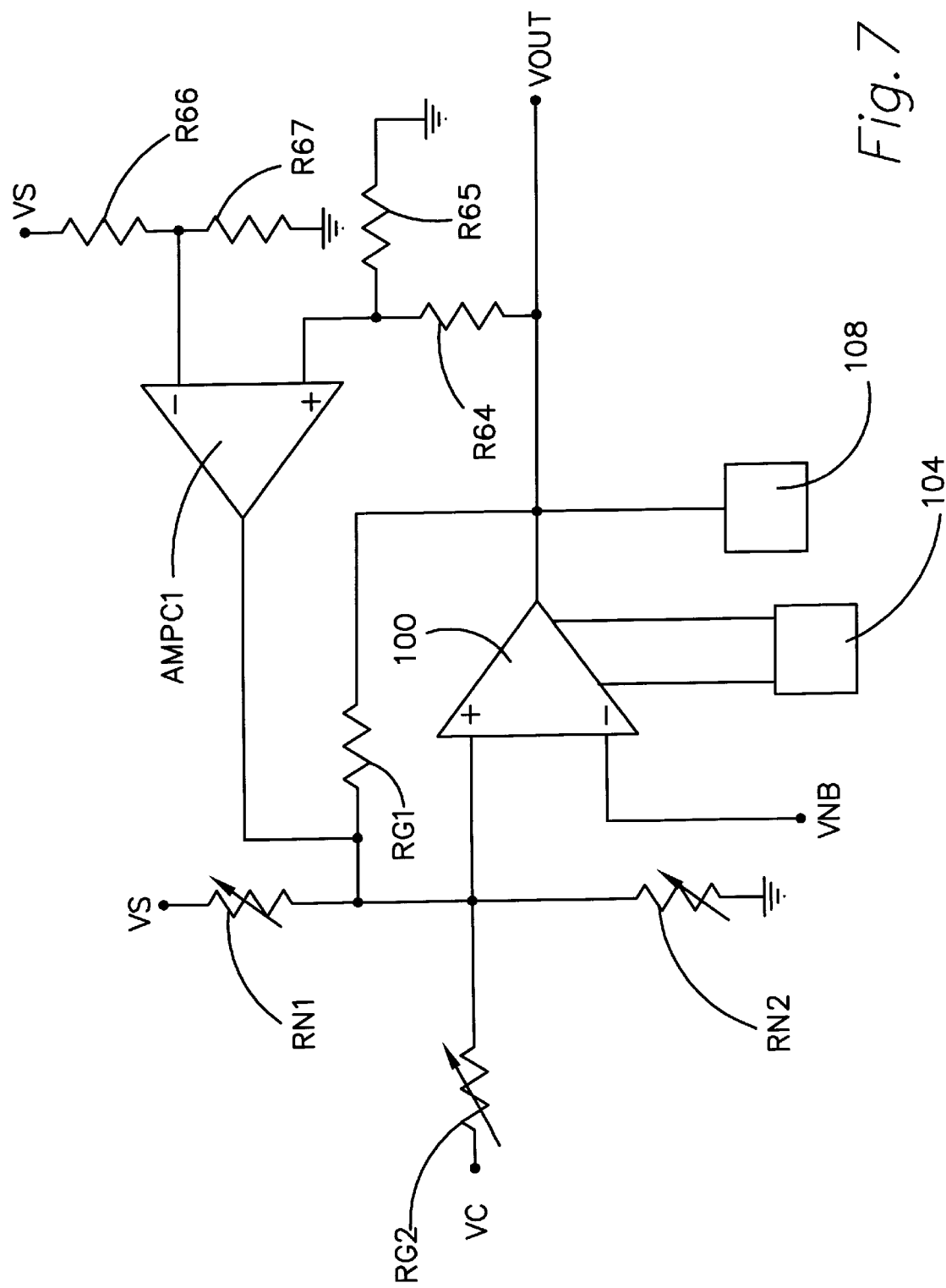
FIG. 7 shows an embodiment of the present invention which incorporates a means for clamping the output voltage at a preselected percentage of the supply voltage.

FIG. 7 is an illustration of FIG. 6 with certain additional components. These additional components relate to the amplifier $AMP_{C1}$ and its related resistors, $R_{64}$–$R_{67}$. By comparing FIGS. 6 and 7, it can be seen that the amplifier $AMP_{C1}$ is provided with its output connected to the inverting input of the sixth amplifier 100. The reasons for the additional amplifier in FIG. 7 will be explained in conjunction with FIG. 8.

Figure 8:
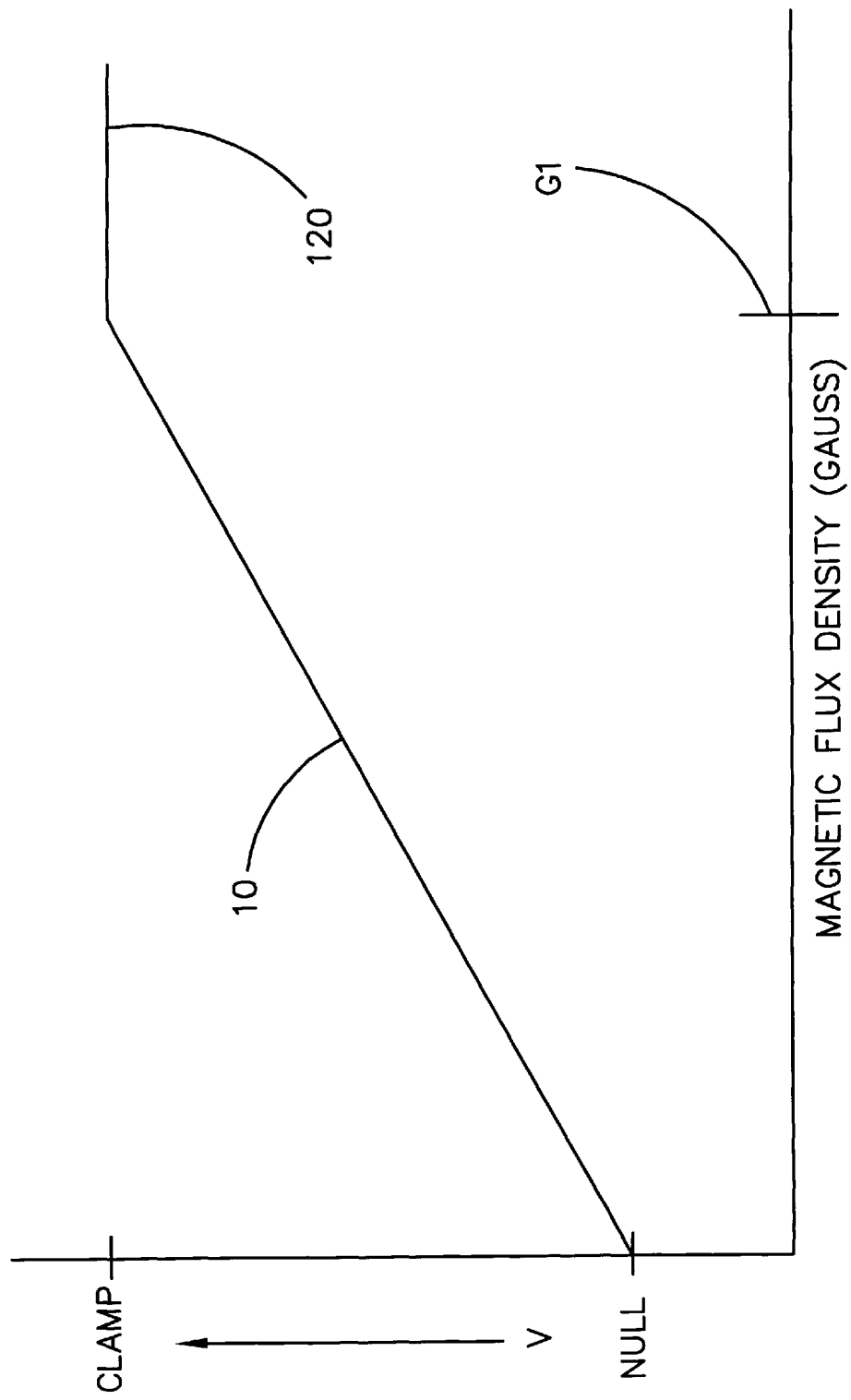
FIG. 8 shows the relationship of the Hall output voltage to the magnetic flux density in the embodiment of the present invention shown in FIG. 7.

In FIG. 8, the relationship between the Hall circuit output voltage, $V_{OUT}$, and the imposed magnetic flux density is represented. Line 10, which is generally analogous to line 10 in FIG. 1, represents the relationship between the Hall circuit output voltage and the magnetic field after the signal has been compensated for variations in the previously described manner. FIG. 8 shows a constant output voltage which is represented by line 120 for magnetic flux densities above a predetermined magnitude that is represented as G1 in FIG. 8.

It is well known that output signals can be clamped, or truncated, at a predetermined value. This is done for many reasons and can be accomplished by various known techniques. For example, if a transducer provides an output voltage from zero to ten volts based on a monitored parameter, the output voltage from the transducer can be arbitrarily clamped at, for example, 8.7 volts to suit a particular application of the transducer. The present invention also provides a means by which the output signal of the Hall effect apparatus can be clamped, or truncated, to a predetermined output voltage when the voltage would otherwise exceed that predetermined value. However, in the present invention, the output voltage is clamped to a value that is determined as a percentage of a variable voltage. In other words, a preferred embodiment of the present invention limits the output voltage from the Hall effect device to a magnitude which is 93 percent of the supply voltage, $V_S$. Therefore, the magnitude of the clamp voltage which is represented by line 120 in FIG. 8 is always maintained at a value of 93 percent of the supply voltage, $V_S$, and the Hall circuit output will not provide a voltage that exceeds that value. Therefore, the output of the Hall device would follow line 10 as a function of the magnetic flux density imposed on the Hall element until the output voltage from the Hall device equals the clamping voltage represented by line 120 which is a function of the possibly varying supply voltage, $V_S$.

With reference to FIGS. 7 and 8, the amplifier, $AMP_{C1}$, shown in FIG. 7 is provided with a voltage, at its inverting input, that is determined by resistors $R_{66}$ and $R_{67}$. As can be seen in FIG. 7, these two resistors provide a voltage divider that is referenced to the supply voltage, $V_S$, and which establishes the voltage at the inverting input at a value that will cause amplifier $AMP_{C1}$ to provide a signal at the inverting input of the sixth amplifier 100 when the output signal from the sixth amplifier attempts to exceed the preselected clamping voltage magnitude. In this way, the output $V_{OUT}$ from the sixth amplifier 100 can be limited to a preselected ratio of the supply voltage, $V_S$, and this relationship can be dynamically maintained even when the supply voltage changes. As a result, the circuit shown in FIG. 7 will result in a relationship between the output voltage, $V_{OUT}$, and the magnetic flux density as shown in FIG. 8.

Figure 9:
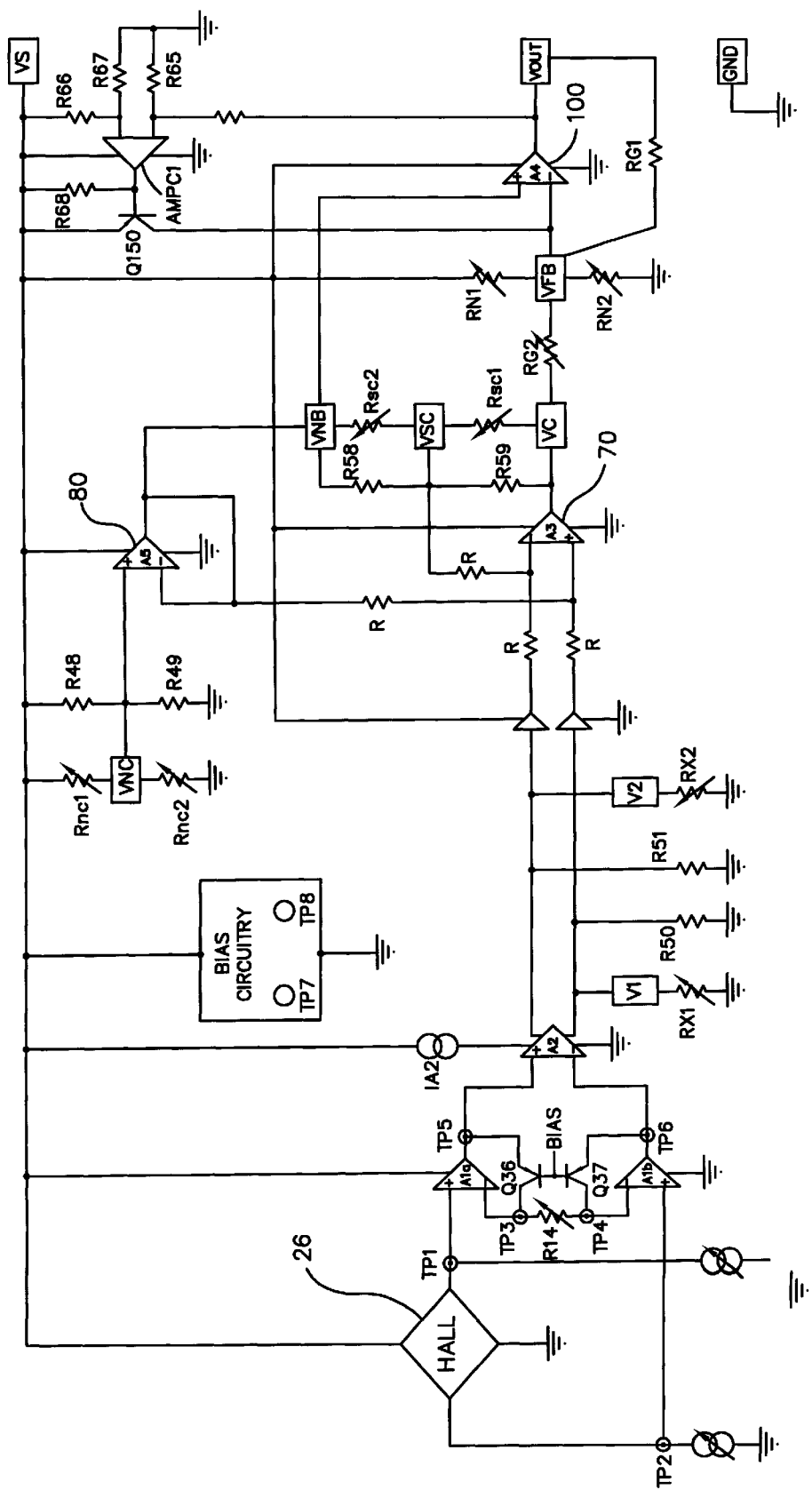
FIG. 9 is a functional block diagram of the present invention.

FIG. 9 is a functional block diagram of a circuit made in accordance with the present invention. The illustration shown in FIG. 9 is a simplified schematic of the present invention. It shows the various subcircuits that are used to perform the functions described above in conjunction with FIGS. 4–8. For example, FIG. 9 shows the Hall device 26 associated with its two amplifiers that are provided with feedback by transistors $Q_{36}$ and $Q_{37}$. In addition, it shows amplifier $A_2$ with its current source and the source of a bias voltage at the bases of the two feedback transistors.

Comparing FIGS. 5 and 9, the fourth amplifier 70 can be seen connected to the outputs, $V_1$ and $V_2$, with resistors R59 and R58 and trimmable resistors $R_{SC1}$, and $R_{SC2}$. FIG. 9 also shows the fifth amplifier 80 associated with resistors $R_{48}$ and $R_{49}$. In addition, trimmable resistors $R_{NC1}$ and $R_{NC2}$ are provided. The circuit points where the various voltages are externally accessible are labeled in FIG. 9 by boxes. The sixth amplifier 100 is shown with resistor $R_{G1}$ provided as its feedback and trimmable resistors $R_{N1}$, $R_{N2}$, and $R_{G2}$. The sixth amplifier 100 which is shown in the right portion of FIG. 9 was described above in greater detail in conjunction with FIG. 6. The clamping amplifier $AMP_{C1}$ is also shown in FIG. 9 in conjunction with its inverting input, that is a ratio of the supply voltage $V_S$ as determined by resistors $R_{66}$ and $R_{67}$, and its noninverting input that is a ratio of the output voltage $V_{OUT}$ as determined by resistors $R_{64}$ and $R_{65}$.

The output of AMPC1 is pulled up to $V_S$ through base-pinch resistor R68 shutting off transistor Q150 until the noninverting input voltage rises to be equal to or greater than the inverting input voltage at which point collector current from Q150 starts to flow into the inverting node of amplifier A4 counteracting the current flow out of the inverting node through $R_{G2}$ due to the magnetic flux density increasing. Therefore the clamp voltage onset occurs when the AMPC1 noninverting voltage approximately equals the inverting voltage.

Figure 10:
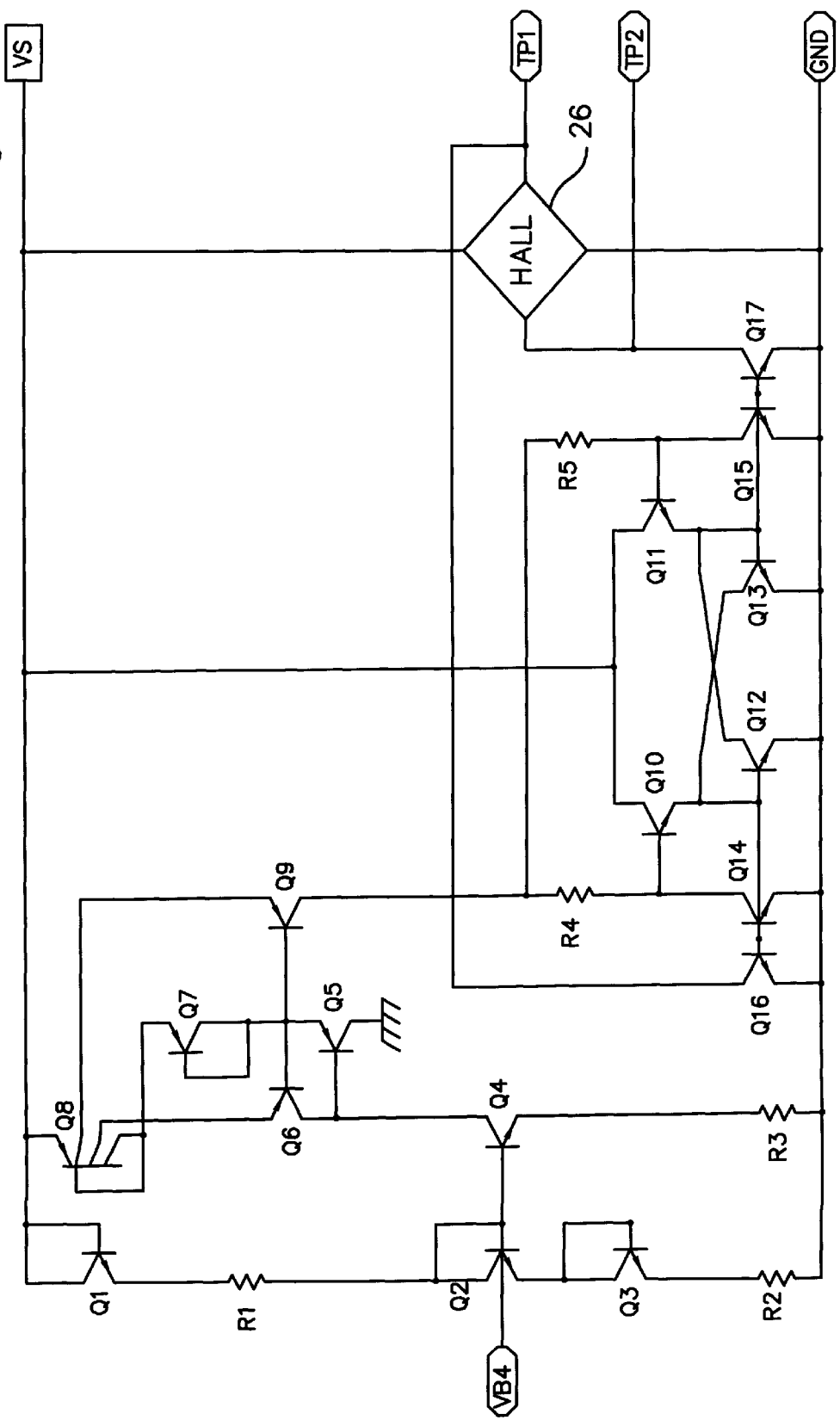
FIG. 10 is the quad-Hall input stage of the present invention.

FIG. 10 is a detailed schematic of the Hall input stage. The voltage at the bottom of $R_4$ is equal to $V_{BE(Q10)}$ plus $V_{BE(Q12)}$ and the voltage at the bottom of $R_5$ is equal to $V_{BE(Q11)}$ plus $V_{BE(Q13)}$. Since Q13 is cross-coupled with Q10 then $V_{BE(Q10)}$ is equal to $V_{BE(Q13)}$ and likewise Q12 is cross-coupled with Q11 so $V_{BE(Q11)}$ is equal to $V_{BE(Q12)}$. Therefore the voltages at the bottom of $R_4$ and $R_5$ are equal as are their voltages at the top since they are tied together. So $R_4$ and $R_5$ simply act as current dividers. Trimming on $R_4$ decreases the collector current of Q16 while increasing the collector current of Q17 and vice versa for trimming on $R_5$. The current divided by $R_4$ and $R_5$ is formed by transistors Q1–Q9 and resistors $R_1$–$R_3$, where R3 is an epitaxial resistor. This current is proportional to $V_S$ and inversely proportional to the epitaxial sheet resistance. Therefore this current tracks and cancels the change in Hall resistance due to temperature changes. Likewise, the current tracks and cancels the change in the Hall element offset voltage due to supply voltage, $V_S$, changes.

Figure 11:
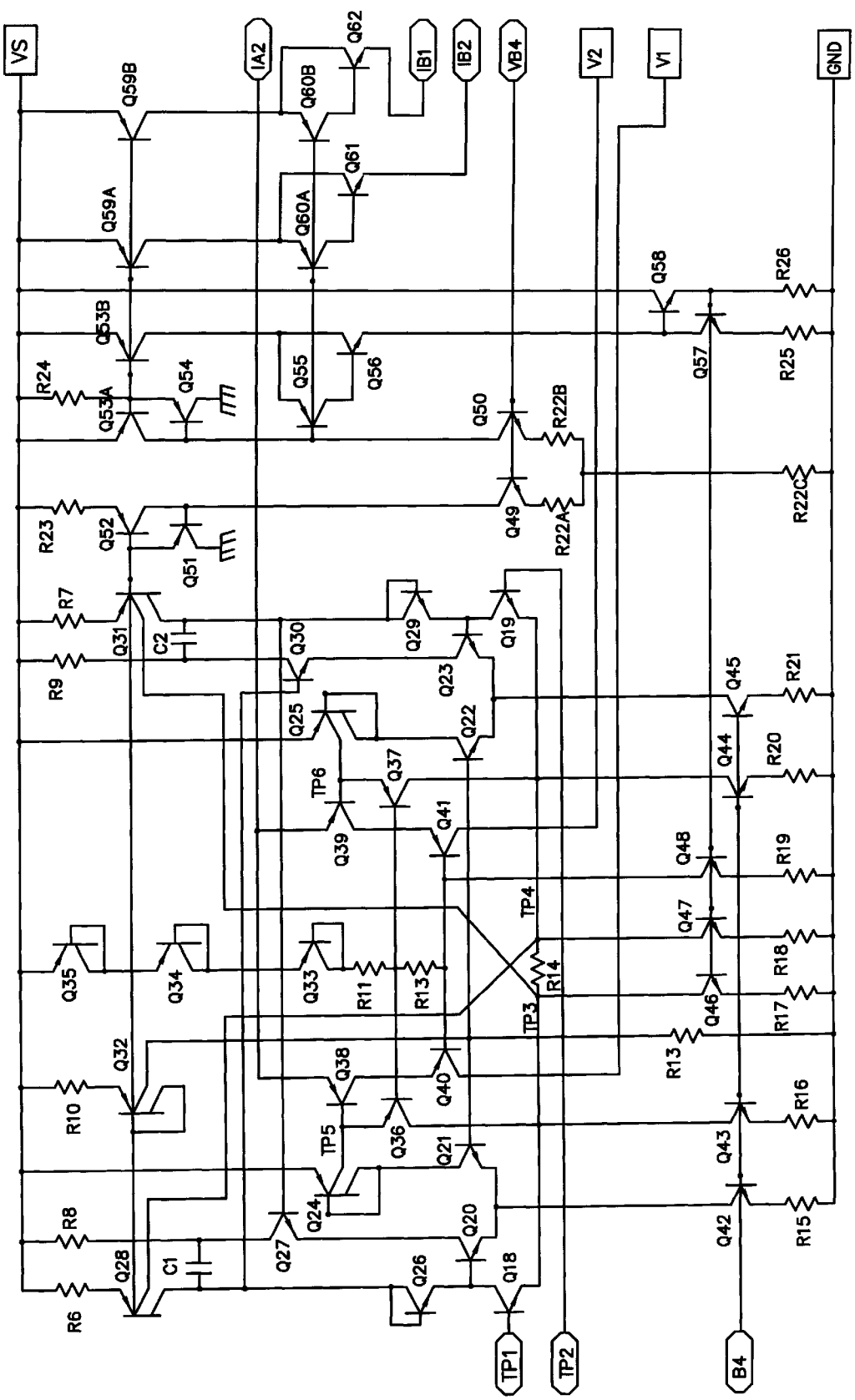
FIG. 11 shows the primary temperature compensation amplifiers of the present invention.

FIG. 11 is a detailed schematic illustration of the primary temperature compensation amplifiers. For example, transistors Q36 and Q37 which are shown in FIG. 4 are illustrated in FIG. 11 along with the components that provide the amplifiers, $A_{1a}$, $A_{1b}$, $A_2$, and the components that provide the bias voltage for the bases of transistors Q36 and Q37.

Figure 12:
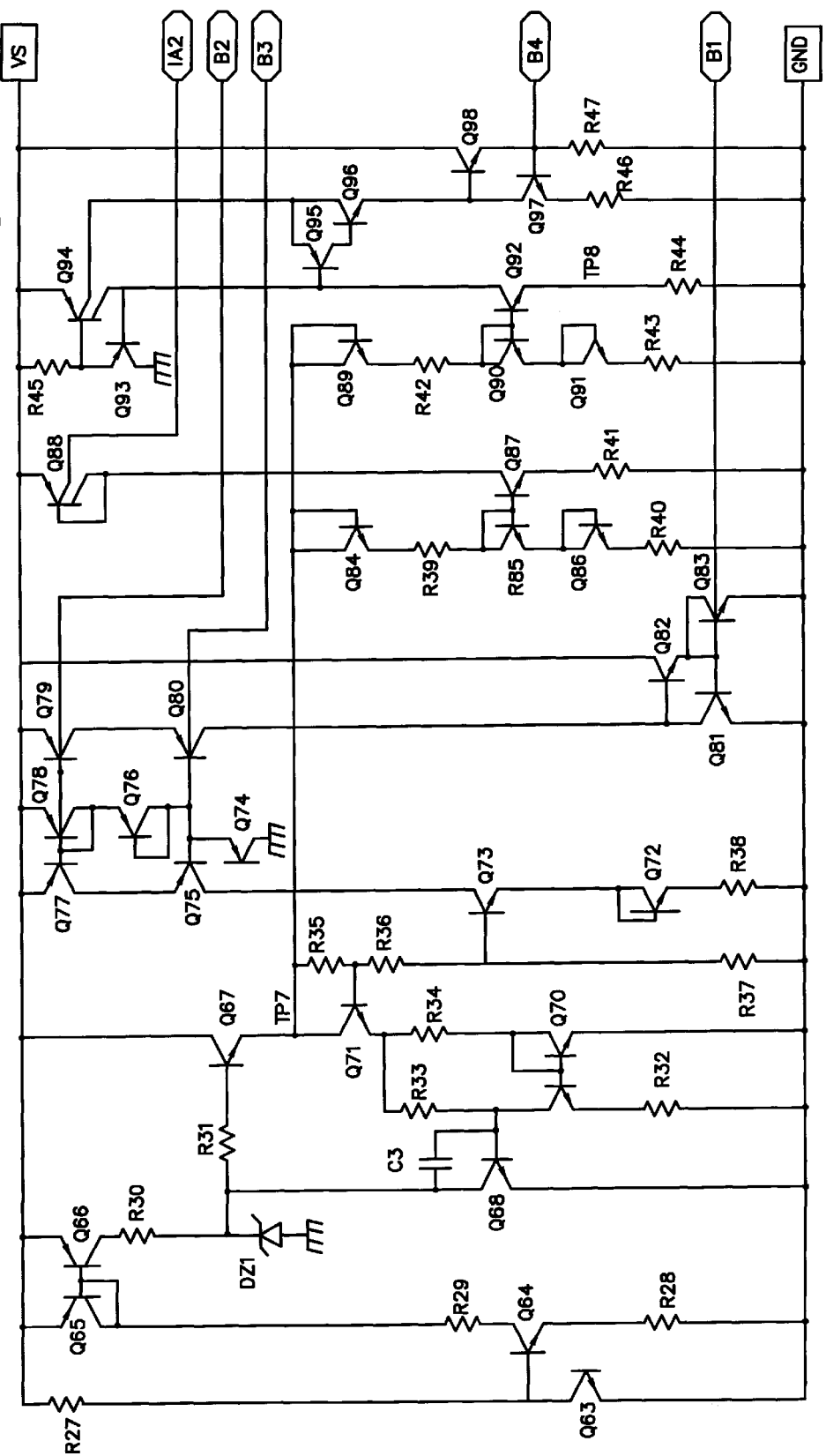
FIG. 12 shows the voltage reference and current sources of the present invention.
Figure 13:
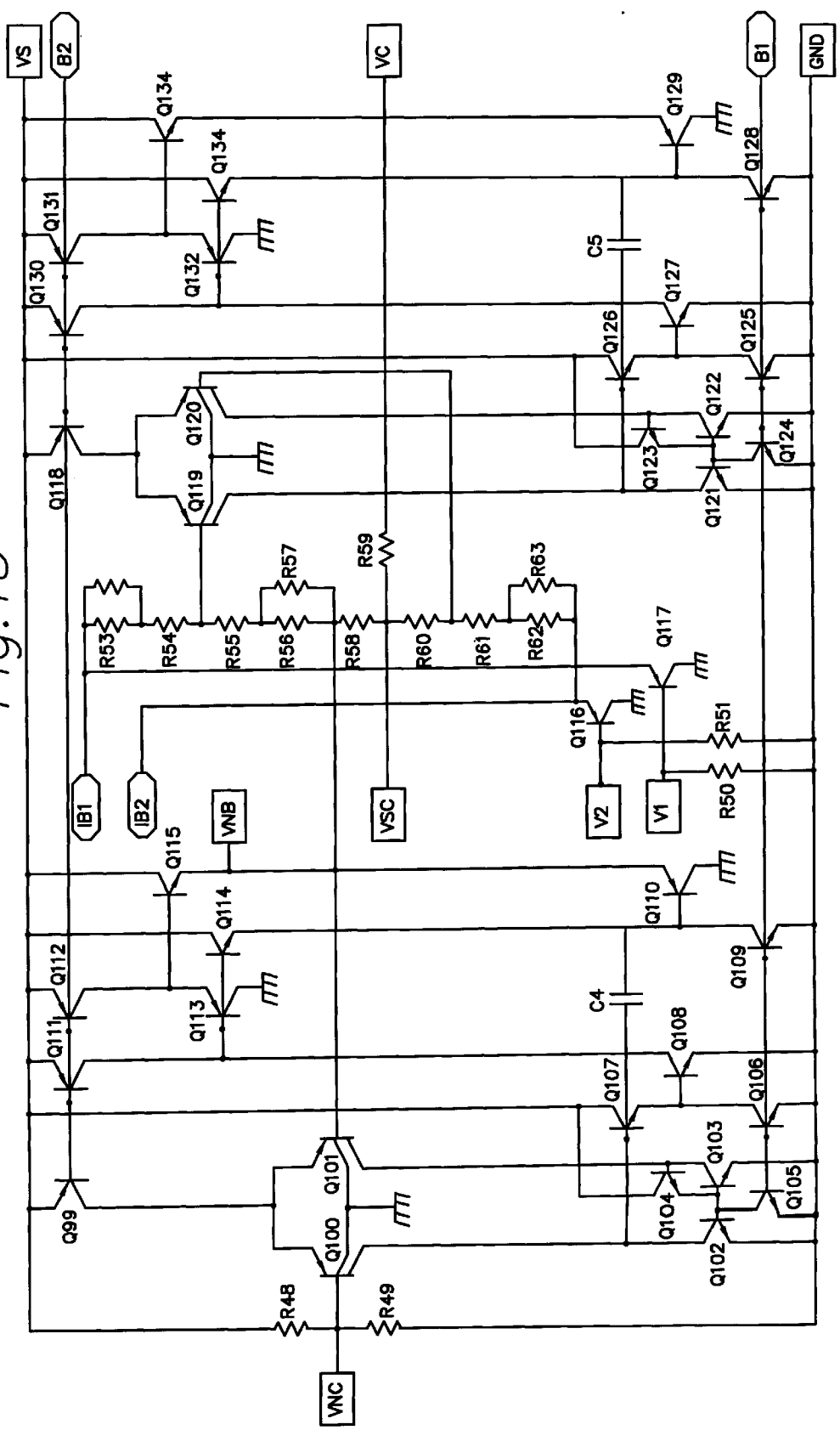
FIG. 13 shows the temperature compensation adjustment amplifiers of the present invention.
Figure 14:
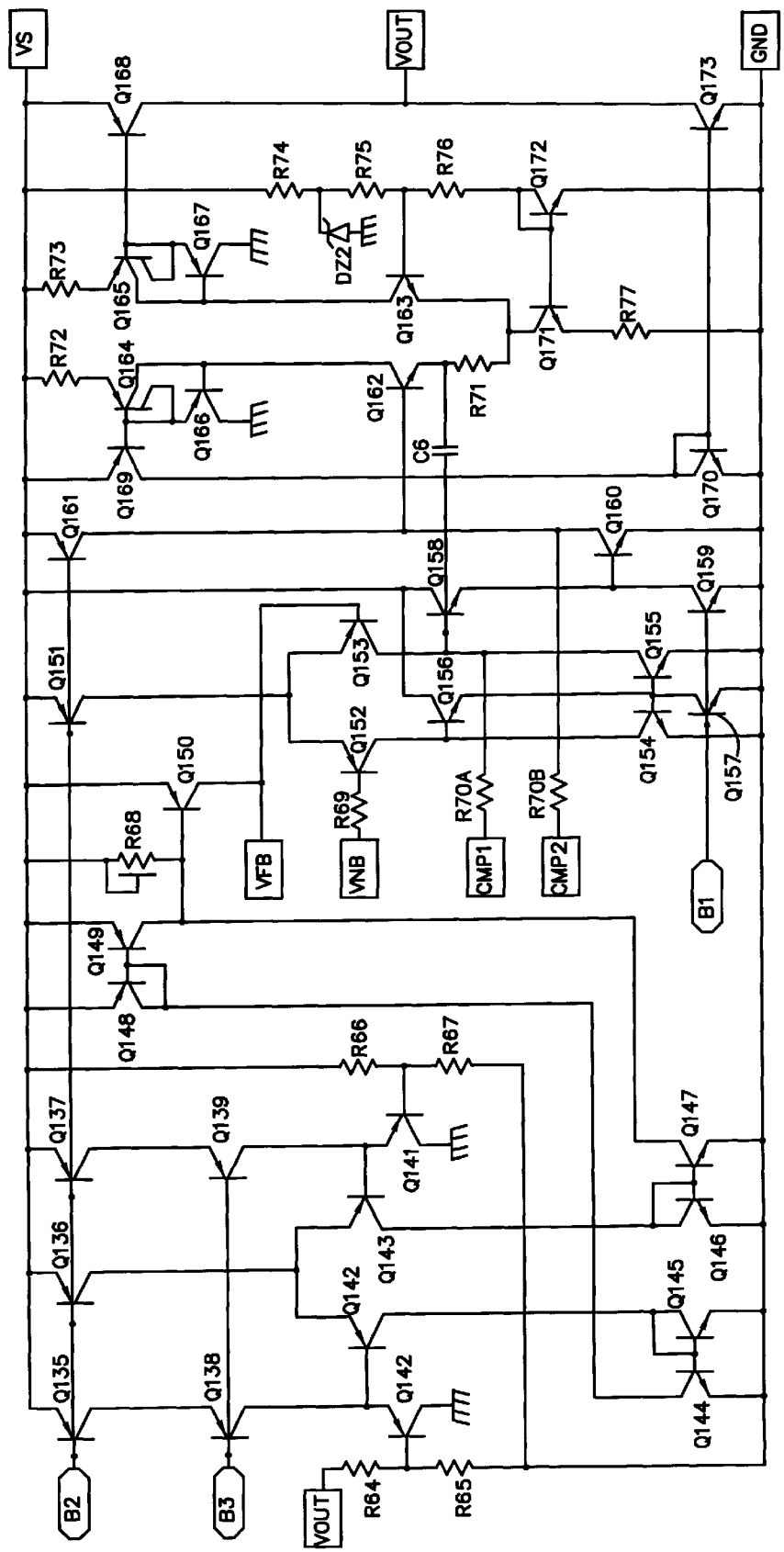
FIG. 14 shows the output amplifiers and clamping stage of the present.

FIG. 12 is a detailed schematic of the voltage reference and current sources used in the preferred embodiment of the present invention. FIG. 13 is a detailed schematic of the temperature compensation adjustment amplifiers that have been described above in conjunction with FIGS. 5–7. FIG. 14 is a detailed schematic of the output amplifiers and the clamp circuit of the present invention. For example, in the left portion of FIG. 14, resistors $R_{66}$ and $R_{67}$ are shown in conjunction with the individual components that provide the clamping amplifier $AMP_{C1}$.

In the description above, FIGS. 2 and 3 were used to describe the current state of the prior art in temperature compensation circuitry. FIGS. 4, 5, 6 and 7 show simplified schematic drawings of the subcircuits used to accomplish the overall function of the present invention. FIG. 9 shows a functional block diagram of the present invention for the purpose of illustrating the interconnection of the subcircuits. FIGS. 10–14 are detailed schematics that show the particular components used to accomplish the functions in the subcircuits of FIGS. 5–7.

The most preferred embodiment of the present invention provides a linear Hall sensor that is specifically designed for use in an automotive rotary position sensor. The circuit of the present invention comprises seven main functional blocks: a quad-Hall element with offset trim circuitry, a first stage differential temperature compensating amplifier with input and output offset trim circuitry, a band-gap voltage reference to generate critical supply independent reference currents, an interstage differential amplifier with external resistor control of the gain shift over temperature, a buffer amplifier with external resistor control of the offset (null) shift over temperature, an output stage summing amplifier for room temperature transfer function adjust capability, and a voltage comparator to provide the output clamp function in applications where this feature is desired. The quad-Hall element portion of the present invention is used and located generally in the center of the chip to provide for minimum offset shift due to thermal and stress gradients. It is connected directly across the power supply to provide for ratiometric sensitivity. The Hall element offset voltage is minimized by providing trimmable film resistors that control current source loads on the Hall outputs which track with the supply voltage VS, and the epitaxial sheet resistance thermal coefficient of resistance (TCR). The initial gain stage is comprised of two differential-to-differential amplifiers. The first amplifier is a frequency compensated current feedback amplifier with approximately 40 dB of loop gain. This amplifier compensates for the dependence of the Hall element sensitivity on the epitaxial thermal coefficient of resistance. The second amplifier is an emitter-coupled differential amplifier which compensates for the dependence of the Hall element sensitivity on the temperature coefficient of the Hall effect scattering coefficient. The input offset voltage of the first amplifier is minimized by trimmable film resistors that control the current source loads of the input transistor pair. The differential output current of the second amplifier is converted to a differential voltage across the near zero thermal coefficient of resistance thin film pair of resistors, $R_{50}$ and $R_{51}$. Trimming on the near zero thermal coefficient of resistance external film resistors, $R_{X1}$ and $R_{X2}$ in parallel with the on-chip film resistors, $R_{50}$ and $R_{51}$, allows the amplifier output offset voltage to be minimized at room temperature after the die attachment process is completed.

The band-gap voltage reference is used to provide a bias voltage that is temperature stable and independent of the voltage supply. This bias voltage is used to generate the temperature compensating reference currents for $I_{A1}$ and $I_{A2}$ that are used in the initial gain stage. The PTAT (Proportional To Absolute Temperature) reference currents used in the other operational amplifiers and the output clamping circuit are also generated as a function of the bias voltage. The interstage circuit is comprised of an emitter-follower buffer and a frequency compensated differential-to-single-ended operational amplifier with a loop gain of 110 dB. The feedback network for this amplifier contains a pair of approximately 3,000 ppm/C implant resistors, $R_{58}$ and $R_{59}$, which act as thermistors. Trimming of the near zero thermal coefficient of resistance external film resistors, $R_{SC1}$ and $R_{SC2}$, in parallel with implant resistors, $R_{58}$ and $R_{59}$, allows the slope of the gain shift over temperature to be adjusted slightly positive or negative to provide sensitivity shift compensation for the basic level component. The offset buffer is a frequency compensated differential-to-single-ended operational amplifier with a loop gain of 110 dB that is connected for unity gain voltage follower operation. A power supply referenced voltage divider network is formed with a pair of approximately 3000 ppm/C implant resistors, $R_{48}$ and $R_{49}$, which act as thermistors. Trimming on the near zero thermal coefficient of resistance external film resistors, $R_{NC1}$ and $R_{NC2}$, in parallel with implant resistors, $R_{48}$ and $R_{49}$, allows the slope of the offset voltage (null) shift over temperature to be adjusted slightly positive or negative to provide null shift compensation for the basic level component.

The output gain stage of the present invention is a frequency compensated differential-to-single-ended operational amplifier with a loop gain of 110 dB. It is configured as a summing amplifier with output current source or current sink capability, and rail-to-rail operation is possible because of a common emitter output driver. External frequency compensation is available when driving high capacitive loads. The near zero thermal coefficient of resistance external film resistors in the amplifier feedback network, $R_{G2}$, $R_{N1}$ and $R_{N2}$, are trimmed during an operation to set the room temperature transfer function which minimizes the effects of package stress on the offset voltage and accounts for variations in the chip and magnetic system on the sensitivity setting. The linear range of the output is to be limited to approximately 93 percent of the power supply voltage in a particularly preferred embodiment of the present invention. A voltage comparator is used to clamp the output. The output voltage is monitored by a 50 percent voltage divider. Another voltage divider connected directly across the power supply establishes a ratiometric 93 percent of supply reference voltage. The center taps of the dividers are connected to the inputs of the comparator. The output of the comparator is a current source that injects current into the summing node of the output amplifier which balances the current drawn from the summing node due to the Hall signal. Clamp stability is tightly coupled with the frequency compensation in the output stage.

With reference to the equations shown below, equation 17 represents the transfer function of the present invention. Current $I_{A1}$ is inversely proportional to the epitaxial thermal coefficient of resistance and therefore provides the primary temperature compensation for the Hall effect element. $I_{A2}$ and $K_{QB}$, the high level injection function, compensate for the temperature coefficient of the Hall scattering coefficient. The ratio of $R_{SC1}$ to $R_{SC2}$ controls the sensitivity shift compensation for the basic level component and the ratio of $R_{NC1}$ to $R_{NC2}$ controls the null shift compensation. Resistors $R_{X1}$ and $R_{X2}$ provide bi-directional amplifier offset voltage balance capability in order to help minimize the interaction between the sensitivity and the offset voltage trims. Resistors $R_{N1}$ and $R_{N2}$ provide bi-directional trim capability for the output offset voltage. Resistor $R_{G2}$ provides unidirectional trim capability for the output sensitivity. In order to simplify equations, certain nomenclature is used. For example, the expression $R_{50}//R_X$ means the effective resistance that is obtained by connecting resistor $R_{50}$ in parallel with resistor $R_X$.

With reference to FIGS. 4 and 9 and ignoring base currents, the relationships shown in equations 1 and 2 can be stated.

$$I_{C(Q36)}+I_{B1}/2+I_{B2}/2=I_H+I_{B3}+I_{A1} \tag{1}$$

$$I_{C(Q37)}+I_{B2}/2+I_{B1}/2=-I_H+I_{B3}+I_{A1} \tag{2}$$

By selecting the current identities shown in equation 2A, the relationships shown in equations 3, 3A and 3B are achieved.

$$I_{B1}=I_{B2}=I_{B3} \tag{2A}$$

$$I_{C(Q36)}=I_{A1}+I_H \tag{3}$$

$$I_{C(Q37)}=I_{A1}-I_H \tag{3A}$$

$$V_{BE(Q18)}=V_{BE(Q19)} \tag{3B}$$

With the relationships from the previous equations and defining the thermal voltage, $V_T$, as Boltzman's constant times temperature in Kelvin divided by one electronic charge, equations 4, 4A, and 4B can be developed.

$$V_{TP5}-V_{TP6}=V_T L_n(I_{C(Q36)}/I_{C(Q37)}) \tag{4}$$

$$V_{TP5}-V_{TP6}=V_T L_n((I_{A1}+I_H)/(I_{A1}-I_H)) \tag{4A}$$

$$V_{TP5}-V_{TP6}=V_T L_n((1+I_H/I_{A1})/(1-I_H/I_{A1})) \tag{4B}$$

Using the relationships shown in equations 4B, 5, 6, and 6A, the relationships of equations 7 and 8 can be developed.

$$\text{Tanh}^{-1}(X)=0.5 L_n((1+X)/(1-X)) \tag{5}$$

$$V_H=V_{TP1}-V_{TP2} \tag{6}$$

$$I_H=V_H/R_{14} \tag{6A}$$

$$V_{TP5}-V_{TP6}=2(V_T \text{Tanh}^{-1}(I_H/I_{A1})) \tag{7}$$

$$V_{TP5}-V_{TP6}=2(V_T \text{Tanh}^{-1}(V_H/(R_{14}I_{A1}))) \tag{8}$$

With reference to the drawings, current $I_{A1}$ is equal to the voltage at test point TP8 divided by the epitaxial resistor, $R_{44}$, as represented in equation 9. In order to minimize gain ratiometricity error, current source $I_{A1}$ is developed from a band-gap reference voltage $V_{TP7}$ so that $V_{TP8}$ is effectively independent of the supply voltage, $V_S$. In addition, $V_{TP8}$ is designed to have nearly zero temperature dependence. This results in a current source, $I_{A1}$, which is only inversely proportional to the epitaxial thermal coefficient of resistance (TCR). This provides the dominant temperature compensation for the variation in the Hall element sensitivity over temperature.

$$I_{A1} = V_{TP8}/R_{44} \quad (9)$$

The transfer function for the emitter-coupled differential amplifier A2 is shown in equation 10.

$$I_1 - I_2 = -I_{A2} \tanh((V_{TP5} - V_{TP6})/2V_T) \quad (10)$$

Combining equations 8 and 10 results in equation 11.

$$I_1 - I_2 = (-V_H/R_{14})(I_{A2}/I_{A1}) \quad (11)$$

The differential current, $I_1-I_2$, is converted to a differential voltage, $V_1-V_2$, by resistors 60 and 62 as shown in FIG. 4. Referencing FIG. 9, resistor 60 is a parallel combination of film resistor R51 and external film resistor $R_{X2}$. Likewise, resistor 62 is a parallel combination of film resistor $R_{50}$ and external film resistor $R_{X1}$. In the following discussion, the general expression $R_A//R_B$ means the equivalent resistance of resistors $R_A$ and $R_B$ connected in parallel. Using the relationship for resistors 60 and 62 as shown in equation 12, the expression for $V_1-V_2$ is shown in equation 12A.

$$R_F = (R_{50}//R_{X1} + R_{51}//R_{X2})/2 \quad (12)$$

$$V_1 - V_2 = -V_H(R_F/R_{14})(I_{A2}/I_{A1}) \quad (13)$$

To minimize gain ratiometricity error, current source $I_{A2}$ is also developed from the band-gap reference voltage, $V_{TP7}$. The most preferred embodiment of the present invention necessitates bias current levels, $I_{A1}$ and $I_{A2}$, through transistors Q36–Q39 that are generally of the order of magnitude where high level injection effects are noticeable in bipolar lateral PNP transistors. For example, for the injected current level, $I_{A1}$, into the emitters of Q36 and Q37, a larger differential voltage, $V_{TP5}-V_{TP6}$, is generated than would be predicted by the low level injection equation 4. Similarly, for the injected current level, $I_{A2}$, into the emitter of Q38 and Q39, and for a given input differential voltage, $V_{TP5}-V_{TP6}$, a smaller differential current, $I_1-I_2$, is generated than would be predicted by the low level injection equation 10. By design, the bias current levels at room temperature through Q36–Q39 are equal and therefore the net high level injection effects cancel each other such that equation 12A is accurate at room temperature. However, since $I_{A1}$ changes substantially over temperature, there is a non-trivial temperature coefficient associated with the net high level injection effects that will be represented as $K_{QB}$. Including the high level injection effect, $K_{QB}$, with equation 12A results in equation 13A.

$$V_1 - V_2 = -V_H(R_F/R_{14})(I_{A2}/I_{A1})K_{QB} \quad (13A)$$

Current $I_{A2}$ is used to compensate for the secondary temperature effects such as the Hall scattering coefficient and the high level injection, $K_{QB}$. $I_{A2}$ may also be used to adjust the temperature response of the Hall circuit sensitivity to better match the temperature response of the magnetic system. It is also worth noting that since both $I_{A1}$ and $I_{A2}$ are independent of the supply voltage, $V_S$, then so is $K_{QB}$ which helps to minimize gain ratiometricity error.

Equation 13A thus describes a differential voltage, $V_1-V_2$, which accurately reflects the change in the applied magnetic flux density and compensates for the Hall effect variations over temperature on average. To allow for individual devices to be temperature compensated for the small residual null shift and sensitivity shift variations, interstage amplifiers $A_3$ and A5 are provided.

The transfer function for the interstage amplifiers is shown in equations 14, 15 and 15A.

$$V_{NB} = V_S/(1 + (R_{48}//R_{NC1})/(R_{49}//R_{NC2})) \quad (14)$$

$$V_C = (V_1 - V_2)(1 + (R_{59}//R_{SC1})/(R_{58}//R_{SC2})) + V_{NB} \quad (15)$$

$$V_C = (V_1 - V_2)(1 + (R_{59}//R_{SC1})/(R_{58}//R_{SC2})) \quad (15A)$$

$$+ V_S/(1 + (R_{48}//R_{NC1})/(R_{49}//R_{NC2}))$$

By design, the pre-trim ratio of $R_{SC1}/R_{SC2}$ is the same as the ratio of $R_{59}/R_{58}$. This produces an amplifier gain which is constant over temperature. Trimming on either $R_{SC1}$ or $R_{SC2}$ changes the ratio of $R_{SC1}/R_{SC2}$ with respect to the ratio of $R_{59}/R_{58}$ which produces an amplifier gain with a slightly positive or negative temperature coefficient. Likewise, the pre-trim ratio of $R_{NC1}/R_{NC2}$ is the same as the ratio of $R_{48}/R_{49}$. This produces an offset voltage, $V_{NB}$, which is constant over temperature. Trimming on either $R_{NC1}$ or $R_{NC2}$ changes the ratio of $R_{NC1}/R_{NC2}$ with respect to the ratio of $R_{48}/R_{49}$ which produces an offset voltage, $V_{NB}$, which has a slightly negative or positive temperature coefficient.

The output amplifier stage, A4, allows the room temperature offset voltage and sensitivity to be adjusted on an individual device basis. The transfer function for the output amplifier is shown in equation 16.

$$V_{OUT} = -V_C(R_{G1}/R_{G2}) + V_{NB}R_{G1}(1/R_{G1}30\ 1/R_{G2} + 1/R_{N1} + 1/R_{N2})$$
$$-V_S(R_{G1}/R_{N1}) \quad (16)$$

The overall transfer function for the Hall circuit that describes the linear (non-clamped) response to a magnetic flux density is shown in equation 17 by combining equations 13–16.

$$V_{OUT} = V_H(R_F/R_{14})(I_{A2}/I_{A1})K_{QB}(1 + (R_{59}//R_{SC1})/(R_{58}//R_{SC2}))$$

$$(R_{G1}/R_{G2}) + (V_S/(1 + (R_{48}//R_{NC1})/(R_{49}//R_{NC2})))R_{G1}(1/R_{G1} + 1/R_{N1} + 1/R_{N2}) - V_S(R_{G1}/R_{N1}) \quad (17)$$

Thus, the present invention avoids the need for placing the voltage sensitive epitaxial resistor in the signal path of the amplifiers. In other words the effect of the epitaxial resistor controls $I_{A1}$ which provides the dominant temperature compensation for sensitivity, but the epitaxial resistor itself is not influenced by the signal path. Coupled with the circuitry for individual device compensation of the residual null shift and sensitivity shift, this invention provides the ability to minimize the temperature induced shifts while maintaining a very high degree of linearity. The resistance and capacitances in FIGS. 9–14 are identified in Table I.

TABLE I

| Reference | Value |
| --- | --- |
| C1 | 20.0 pF |
| C2 | 20.0 pF |
| C3 | 6.0 pF |
| C4 | 10.0 pF |
| C5 | 10.0 pF |
| C6 | 20.0 pF |
| R1 | 20.0 KΩ |
| R2 | 8.0 KΩ |
| R3 | 12.5 KΩ |
| R4 | 5.5 KΩ |
| R5 | 5.5 KΩ |
| R6 | 5.0 KΩ |
| R7 | 5.0 KΩ |
| R8 | 2.5 KΩ |
| R9 | 2.5 KΩ |
| R10 | 4.0 KΩ |
| R11 | 1.0 KΩ |
| R12 | 1.0 KΩ |
| R13 | 26.0 KΩ |

TABLE I-continued

| Reference | Value |
|---|---|
| R14 | 1.0 KΩ |
| R15 | 6.0 KΩ |
| R16 | 2.9 KΩ |
| R17 | 2.5 KΩ |
| R18 | 2.5 KΩ |
| R19 | 2.5 KΩ |
| R20 | 2.9 KΩ |
| R21 | 6.0 KΩ |
| R22A | 2.5 KΩ |
| R22B | 2.5 KΩ |
| R22C | 6.3 KΩ |
| R23 | 5.0 KΩ |
| R24 | 7.0 KΩ |
| R25 | 2.6 KΩ |
| R26 | 9.5 KΩ |
| R27 | 30.0 KΩ |
| R28 | 4.6 KΩ |
| R29 | 2.0 KΩ |
| R30 | 150.0 Ω |
| R31 | 150.0 Ω |
| R32 | 380.0 Ω |
| R33 | 7.2 KΩ |
| R34 | 3.6 KΩ |
| R35 | 1.8 KΩ |
| R36 | 1.3 KΩ |
| R37 | 3.7 KΩ |
| R38 | 30.0 KΩ |
| R39 | 3.4 KΩ |
| R40 | 6.6 KΩ |
| R41 | 7.9 KΩ |
| R42 | 10.0 KΩ |
| R43 | 4.0 KΩ |
| R44 | 11.0 KΩ |
| R45 | 7.0 KΩ |
| R46 | 3.0 KΩ |
| R47 | 10.0 KΩ |
| R48 | 3.0 KΩ |
| R49 | 3.0 KΩ |
| R50 | 17.7 KΩ |
| R51 | 17.7 KΩ |
| R52 | 11.3 KΩ |
| R53 | 1.1 KΩ |
| R54 | 13.9 KΩ |
| R55 | 14.0 KΩ |
| R56 | 1.1 KΩ |
| R57 | 11.3 KΩ |
| R58 | 3.0 KΩ |
| R59 | 1.8 KΩ |
| R60 | 14.0 KΩ |
| R61 | 13.9 KΩ |
| R62 | 1.1 KΩ |
| R63 | 11.3 KΩ |
| R64 | 10.0 KΩ |
| R65 | 10.0 KΩ |
| R66 | 10.0 KΩ |
| R67 | 8.9 KΩ |
| R68 | 160.0 KΩ |
| R69 | 6.5 KΩ |
| R70A | 5.0 KΩ |
| R70B | 5.0 KΩ |
| R71 | 20.0 KΩ |
| R72 | 725.0 Ω |
| R73 | 725.0 Ω |
| R74 | 4.0 KΩ |
| R75 | 10.0 KΩ |
| R76 | 6.0 KΩ |
| R77 | 75.0 Ω |

Although the present invention has been described in considerable detail and illustrated with particular specificity to show a preferred embodiment of the present invention, alternative embodiments are within its scope.

The embodiments of the invention in which an exclusive property or right is claimed are defined as follows:

1. A circuit for providing a limited amplifier output, comprising:

a first source of a first signal;

a first amplifier having a first input and a first output, said first input being connected in electrical communication with said first source;

second amplifier having a second input and a third input, said second amplifier having a second output, said second output being connected to said first input, said third input being connected to said first output, said second amplifier being a current sourcing comparator and said second output being connected to provide a current to said first input to prevent an increase in the magnitude of said first output;

a second source of a reference signal;

first means for providing a second signal which is a first preselected percentage of said reference signal, said second signal being connected to said second input; and second means for providing a third signal which is a second preselected percentage of said first output signal, said third signal being connected in electrical communication with said third input, said first output signal being limited to a magnitude which is generally equal to said reference signal multiplied by the ratio of said first and second preselected percentages;

wherein:

said-first providing means comprises a first voltage divider; and said second providing means comprises a second voltage divider.

2. The circuit of claim 1, wherein:
said second source is a power supply.

3. A circuit for providing a limited amplifier output, comprising:

a first source of a first signal;

a first amplifier having a first input and a first output, said first input being connected in electrical communication with said first source;

a second amplifier having a second input and a third input, said second amplifier having a second output, said second output being connected to said first input, said third input being connected to said first output, said second amplifier being a current sourcing comparator and said second output being connected to provide a current to said first input to prevent an increase in the magnitude of said first output;

a second source of a reference signal;

first means for providing a second signal which is a first preselected percentage of said reference signal, said second signal being connected to said second input; and second means for providing a third signal which is a second preselected percentage of said first output signal, said third signal being connected in electrical communication with said third input, said first output signal being limited to a magnitude which is generally equal to said reference signal multiplied by the ratio of said first and second preselected percentages, said first providing means comprising a first voltage divider, said second providing means comprising a second voltage divider.

4. The circuit of claim 3, wherein:
said reference signal is a supply voltage.

5. The circuit of claim 3, wherein:
said first input signal is a Hall effect output voltage.

6. The circuit of claim 3, wherein:
said first amplifier is an operational amplifier.

7. The circuit of claim 3, wherein:
said second amplifier is an operational amplifier.

* * * * *